United States Patent [19]

Pors et al.

[11] Patent Number: 5,354,716
[45] Date of Patent: Oct. 11, 1994

[54] METHOD FOR FORMING A DRAM MEMORY CELL WITH TAPERED CAPACITOR ELECTRODES

[75] Inventors: Gary A. Pors, Sacramento; Gernia Tang, Folsom, both of Calif.

[73] Assignee: NEC Electronics, Inc., Mountain View, Calif.

[21] Appl. No.: 727,678

[22] Filed: Jul. 10, 1991

Related U.S. Application Data

[62] Division of Ser. No. 518,607, May 2, 1990, Pat. No. 5,068,707.

[51] Int. Cl.$^5$ .............................. H01L 21/70
[52] U.S. Cl. .............................. 437/52; 437/47; 437/60; 437/233; 437/235; 437/947; 437/986; 156/644
[58] Field of Search ............ 437/47, 48, 52, 60, 437/191, 192, 200, 201, 228, 233, 235, 947, 981; 156/644

[56] References Cited

U.S. PATENT DOCUMENTS

| | | | |
|---|---|---|---|
| 3,936,331 | 2/1976 | Luce et al. | 437/981 |
| 4,240,196 | 12/1980 | Jacobs et al. | 437/191 |
| 4,349,408 | 9/1982 | Tarng et al. | 156/628 |
| 4,372,034 | 2/1983 | Bohr | 29/577 |
| 4,372,803 | 2/1983 | Gigante | 156/626 |
| 4,426,687 | 1/1984 | Masuoka | 365/182 |
| 4,536,947 | 8/1985 | Bohr et al. | 29/576 |
| 4,542,340 | 9/1985 | Chakravarti et al. | 324/158 R |
| 4,726,879 | 2/1988 | Bondur et al. | 156/643 |
| 4,792,841 | 12/1988 | Nagasawa et al. | 357/59 |
| 4,814,041 | 3/1989 | Auda | 156/643 |
| 4,863,562 | 9/1989 | Bryant et al. | 156/649 |
| 4,885,261 | 12/1989 | Yoshikawa | 437/981 |
| 4,987,091 | 1/1991 | Kotaki | 437/981 |
| 5,019,522 | 5/1991 | Meyer et al. | 437/29 |
| 5,023,191 | 6/1991 | Sakurai | 437/29 |
| 5,034,336 | 7/1991 | Seki | 437/29 |
| 5,114,873 | 3/1992 | Kim et al. | 437/981 |

FOREIGN PATENT DOCUMENTS

| | | | |
|---|---|---|---|
| 83794 | 8/1971 | Fed. Rep. of Germany . | |
| 44-31932 | 12/1969 | Japan . | |
| 0040978 | 3/1977 | Japan | 437/981 |
| 0072331 | 5/1982 | Japan | 437/233 |
| 57-206068 | 12/1982 | Japan . | |
| 59-141232 | 8/1984 | Japan . | |
| 61-166031 | 7/1986 | Japan . | |
| 0264740 | 11/1986 | Japan | 437/981 |
| 0085444 | 4/1987 | Japan | 437/981 |
| 63-24660 | 2/1988 | Japan . | |
| 63-126248 | 5/1988 | Japan . | |
| 0161645 | 7/1988 | Japan | 437/981 |
| 63-202939 | 8/1988 | Japan . | |
| 0307744 | 12/1988 | Japan | 437/981 |
| 0084722 | 3/1989 | Japan | 437/947 |
| 0119042 | 5/1989 | Japan | 437/981 |
| 0216577 | 8/1989 | Japan | 437/43 |
| 0045933 | 2/1990 | Japan | 437/981 |

OTHER PUBLICATIONS

"Multi-Step Etching of Dissimilar Materials Achieving Selectivity and Slope Control," published in *IBM Technical Disclosure Bulletin*, vol. 28, No. 7, Dec., 1983.

*Primary Examiner*—Tom Thomas
*Attorney, Agent, or Firm*—Skjerven, Morrill, MacPherson, Franklin & Friel

[57] ABSTRACT

A DRAM cell structure having a capacitance electrode with a tapered end surface is disclosed. Accordingly, the cell structure of this invention provides increased yield without increasing the number of process steps required to form the cell structure, A unique process for forming the capacitance electrode with a tapered end surface is also provided.

3 Claims, 9 Drawing Sheets

METHOD FOR FORMING A DRAM MEMORY CELL WITH TAPERED CAPACITOR ELECTRODES

This application is a division of application Ser. No. 07/518,607, filed May 2, 1990 now U.S. Pat. No. 5,068,707.

BACKGROUND OF THE INVENTION

1. Field of the Invention

This invention relates generally to a semiconductor DRAM memory cell and more specifically to an improved semiconductor DRAM memory cell and a method for making the same.

2. Description of the Prior Art

FIG. 1 illustrates a high-capacity dynamic random access memory (DRAM) cell structure. The high-capacity DRAM cell structure 50 has two double level polysilicon cells $20_1$, $20_2$, each of which includes an access transistor 21 and a storage capacitor 22. In the figures, a single number without a subscript refers to like features in each of cells $20_1$, $20_2$ since the cells generally have mirror symmetry about the center of source region 13. For example, cell 20 refers to both cells $20_1$ and $20_2$.

DRAM cell 20 has a pocket 13 of N+ conductivity type formed in a P− conductivity type (P− type) semiconductor substrate 10. Pocket 13, which is part of a diffused bit line, functions as the source for access transistor 21 in both cell $20_1$ and cell $20_2$.

A deep P-type conductivity implant region 11, typically a boron implant, and a shallow N-type conductivity implant region 12, typically an arsenic implant, are each formed a selected distance from edge 13A of source region 13. The distance from edge 13A of source region 13 to edge Y of N-type conductivity implant 12 is the channel length of access transistor 21. P implant isolation region 14, a channel stop region, and field oxide region 15 are formed on the periphery of DRAM cell 50. A thin dielectric layer 18 overlies implant regions 11, 12, and field oxide region 15. A gate oxide layer 27 overlies source region 13 and the channel region. A first polysilicon layer 16 is formed on dielectric layer 18 over field oxide 15 and arsenic implant region 12 and boron implant region 11. First polysilicon layer 16 functions as a storage electrode for capacitor 22 of cell 20. A transfer gate 19 is a second polysilicon electrode that is separated from the first polysilicon electrode by silicon dioxide layer 17 and from the channel region and source 13 by silicon dioxide layer 27.

The double level polysilicon DRAM memory cell, as 2 illustrated in FIG. 1, is widely used in DRAM arrays because the cell size is significantly reduced over other conventional charge storage DRAM cells.

The threshold voltage of transistor 21 is a function of the effective channel length and the coupling of capacitance arsenic region 12 to polysilicon transfer gate 19. Therefore, variations introduced in either the effective channel length or the coupling of capacitance region 12 and transfer gate 19 by fabrication processes reduce yield because the process variations change the coupling in cells $20_1$, $20_2$ which in turn results in different threshold voltages for cells $20_1$, $20_2$.

Cells $20_1$ and $20_2$ (FIG. 1) are fabricated on a semiconductor chip having many thousands of similar cells and successful operation of the chip requires that all such cells on the chip be free of defects. However, the standard process for forming DRAM cells 20 in a memory array frequently results in an unwanted structure that shorts gates $19_1$, $19_2$ in cells $20_1$, $20_2$.

This problem is best understood by considering the fabrication steps used to form prior art DRAM cells 20. The ion implantations used to form capacitance regions 11, 12 in substrate 10 are omitted because these steps are unrelated to the failure mechanism. As shown in FIG. 2, the substrate has P implant isolation region 14 which is overlain by field oxide region 15. A thin silicon oxide layer 18A, typically about 50Å thick, is formed on substrate 10 between field oxide regions 15 which in turn is covered by a silicon nitride layer 18B, typically about 100Å thick, which also overlies the field oxide regions 15. After formation of silicon nitride layer 18B, polysilicon layer 16 is formed which in turn is overlain by a sacrificial oxide layer 40.

After formation of oxide layer 40, a photoresist mask 41 (FIG. 3) is formed on oxide layer 40 with opening 42 that is used to define the extent of capacitance electrode 16 of DRAM cell 20 (FIG. 1). As oxide layer 40 (FIG. 3) is etched, photoresist mask 41 is undercut as shown in FIG. 4. Photoresist mask 41 is subsequently stripped using a wet etch process leaving the structure illustrated in FIG. 5.

Etched oxide layer 40 is used as a mask for a wet etch of capacitance polysilicon layer 16 to form the structure shown in FIG. 6. Sacrificial oxide layer 40 is then removed to leave the structure of FIG. 7. Hence, starting with opening 42 in photoresist mask 41, the extent of capacitance storage electrode 16 was defined by the subsequent etching processes of oxide layer 40 and polysilicon layer 16.

The shape of edge surface 16C of capacitance electrode 16 was formed by the wet etch of capacitance polysilicon layer 16 and angle γ between bottom surface 16A of gate 16 and edge surface 16C is determined by the etching process. Angle γ is typically in the range of about 90° to about 60° with a typical angle being about 80°.

The steep inclination of edge surface 16C is one factor that limits the yield of prior art DRAM cells 20. Oxide layer 17 is formed over polysilicon layer 16. Oxide layer 17 forms a protruding lip 17A as shown in FIG. 8. Lip 17A is the structure which directly contributes to creation of the failure mechanism for DRAM cell 20. Lip 17A extends around the perimeter of elliptical opening 43 (FIG. 8).

After formation of oxide layer 17, a triple-etch, using oxide layer 17 as a mask, is used to remove dielectric layers 18A, 18B between oxide layer $17_1$, $17_2$ so that surface $10_1$ of substrate 10 is exposed. Gate oxide 27 is grown on surface $10_1$, and then the entire structure is overlain by a polysilicon layer 19A (FIG. 9). A mask and a plasma etch are typically used to form gates 19 (FIG. 10) from polysilicon layer 19A.

While the plasma etching removes polysilicon layer 19A over source region 13 (see FIG. 1), polysilicon 19B under lip 17A remains because the plasma etch is shielded from this area by lip 17A.

Accordingly, gate structures $19_1$, $19_2$ are connected by polysilicon 19B and DRAM cells $20_1$, $20_2$ are electrically shorted through gate 19.

Hence, the steep inclination of edge surface 16C of capacitance polysilicon results in protruding lip 17a being formed in overlying oxide layer 17 which in turn results in a failure mechanism for the associated DRAM cell. This failure mechanism is a function of the prior art processing steps so that to obtain increased yield, two additional processing steps are required. To remove polysilicon 19B requires another mask step and an isotropic etch so as to break polysilicon 19B in two places. These additional processing steps while increasing yields also increase processing costs and processing times.

SUMMARY OF THE INVENTION

A double level polysilicon memory cell of this invention for a dynamic random access memory eliminates the gate interconnection failure mechanism of prior art memory cells so that the prior art processing steps required to remove excess polysilicon are unnecessary. Therefore, the memory cell of the invention provides both enhanced yields and enhanced processing time and costs.

The process of this invention shapes a conductive layer, polysilicon in one embodiment, for use in a semiconductor device so that an insulating layer, silicon dioxide (oxide) in one embodiment, subsequently formed over the shaped conductive layer does not grow a lip as in prior art structures. According to the principles of this invention, a selected portion of a conductive layer is first removed using an anisotropic etch. After the anisotropic etch, the remainder of the conductive layer is removed so as to form the desired structure using an isotropic etch.

This two-step etch process forms a conductive structure having a first planar surface contacting another layer of the semiconductor device, a second planar surface substantially parallel to the first planar surface and a selected distance from the first planar surface, and an edge surface joining the first and second planar surface. The angle defined by the intersection of the edge surface with the first planar surface is less than 60°. Typically, the angle is in the range of about 30° to about 60° and preferably about 45°. As described more completely below, this gradually sloping edge surface of the conductive structure is a key feature of this invention.

According to the principles of this invention, a memory cell is formed in a semiconductor substrate with a source region and a capacitance region which are separated by a channel region. A first insulating layer extends over the capacitance region. A capacitance electrode with two ends overlies and is insulated from the capacitance region. The capacitance electrode has a first planar surface contacting the first insulating region. A second planar surface of the capacitance electrode is substantially parallel to said first parallel surface. The capacitance electrode has an edge surface joining an edge of the first planar surface to an edge of a said second planar surface. The angle formed by the intersection of the edge surface with the first planar surface is less than 60°.

A second insulating layer lies on the substrate over the source and channel region and extends over the capacitance electrode. A transfer gate of the memory cell is disposed on said second insulating layer so that the transfer gate extends over but is insulated from the capacitance region and extends over but is insulated from the channel region.

Unlike the prior art memory cells, the tapered end surface of the capacitance electrode joining the first planar surface and the second planar surface is such that the oxide layer formed on the electrode has no lip so that the subsequent processing used to form the transfer gates does not result in a hidden polysilicon connection between the gate structures. Hence, the yield of the DRAM cells formed according to the principle of this invention are not diminished by shorting of the transfer gates as in the prior art structures.

A method for forming the novel structure of this invention includes forming a conductive layer over but insulated from a semiconductor substrate. An insulating layer is disposed on the conductive layer and a photoresist is subsequently placed on the exposed surface of the insulating layer. An opening is formed in the photoresist using conventional processes. The opening is subsequently used in etching processes to define the shape of the polysilicon layer.

After formation of the opening in the photoresist, the exposed insulating layer is etched so that the underlying conductive layer is exposed. The insulating layer etching also undercuts the photoresist mask. An anisotropic plasma etch is then used on the exposed conductive layer so as to remove a selected portion of the conductive layer. In one embodiment the plasma etch removes approximately 50% of the conductive layer because this provides the best shaping profile for subsequent processing steps.

After the plasma etch of the conductive layer, a wet etch is used to remove the remainder of the conductive layer and expose the underlying insulating layer. The plasma etch and the wet etch shape the conductive layer so that the lower planar surface of the conductive layer, which contacts the underlying insulating layer, and the upper planar surface of the conductive layer, which is substantially parallel to the lower planar surface, are joined by an edge surface which intersects the lower planar surface at an angle of less than 60°. As used herein, the terms "upper" and "lower" are relative to the distance from the surface of the substrate. In one embodiment, the shaped conductive layer is the capacitance electrode of the DRAM cell.

Following shaping of the conductive layer, a second wet etch of the insulating layer disposed on the conductive layer removes the insulating layer over the conductive layer so that another portion of upper surface of the conductive layer is exposed.

In the subsequent processing steps, another insulating layer is formed over the exposed regions of the conductive layer, and transfer gates are subsequently formed over this insulating layer. Since the exposed conductive layer has a smooth taper with an inclination substantially less than the inclination of the edge surface of the prior art polysilicon gate, the overlying insulating layer does not form a lip, as in the prior art structure. Consequently, the method of this invention eliminates the failure mechanism of the prior art. Moreover, the relationship of the capacitance gate to the channel region and the capacitance regions remains unchanged and the relationship of the transfer gate to the capacitance regions, channel region and source region remains unchanged. Therefore, the taper process for the capacitance electrode improves yield without affecting performance of the memory cell.

DETAILED DESCRIPTION

Figure 1:
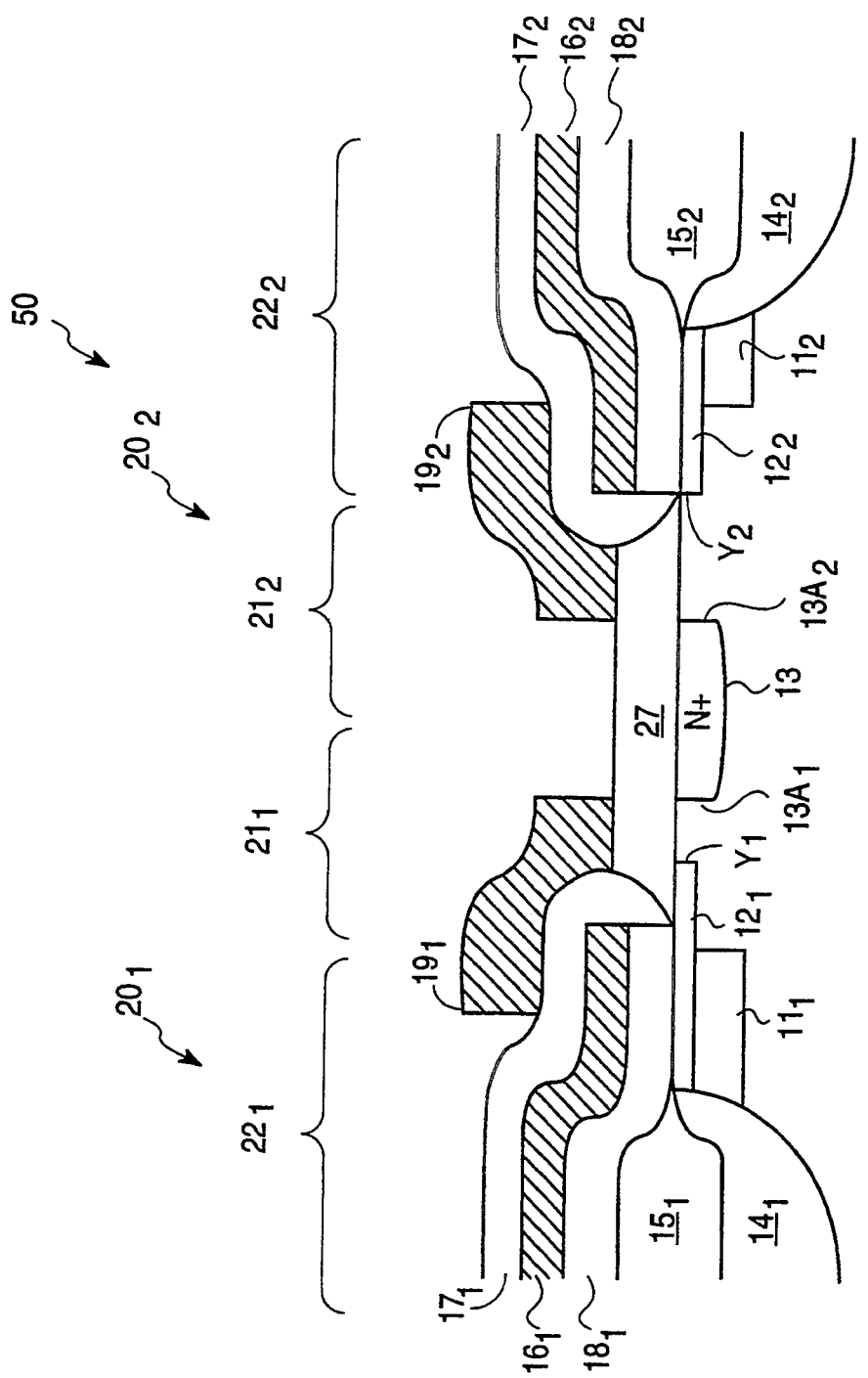
FIG. 1 is a cross section view of a prior art DRAM memory cell.
Figure 2:
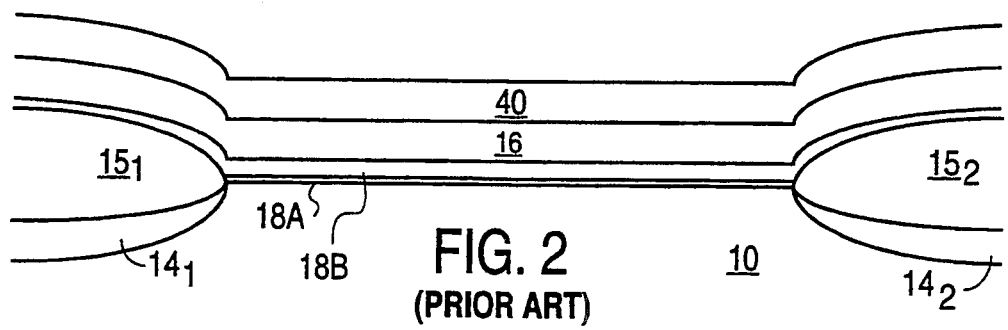
FIG. 2 illustrates a prior art structure used in formation of the prior art DRAM memory cell of FIG. 1.
Figure 3:
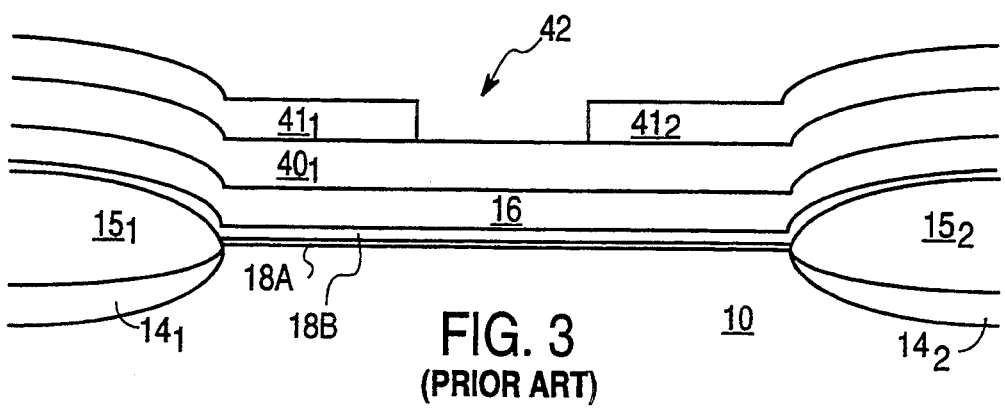
FIG. 3 illustrates a photoresist layer used in formation of the prior art DRAM memory cell.
Figure 4:
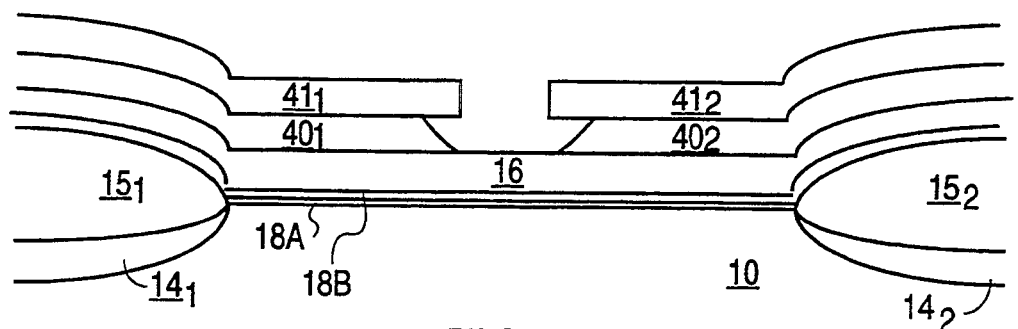
FIG. 4 illustrates the structure of FIG. 3 after etching the oxide layer.
Figure 5:
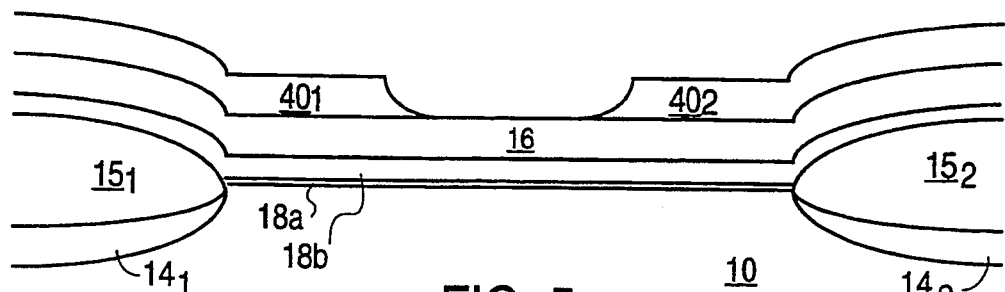
FIG. 5 illustrates the structure of FIG. 4 after removal of the photoresist layer.
Figure 6:
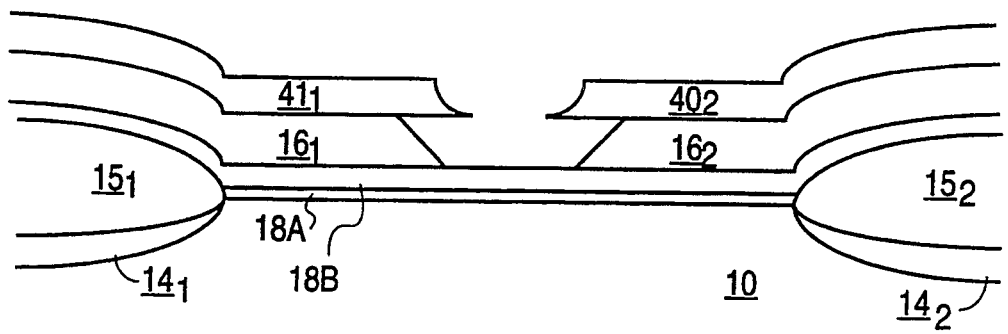
FIG. 6 illustrates the structure of FIG. 5 after etching the polysilicon layer.
Figure 7:
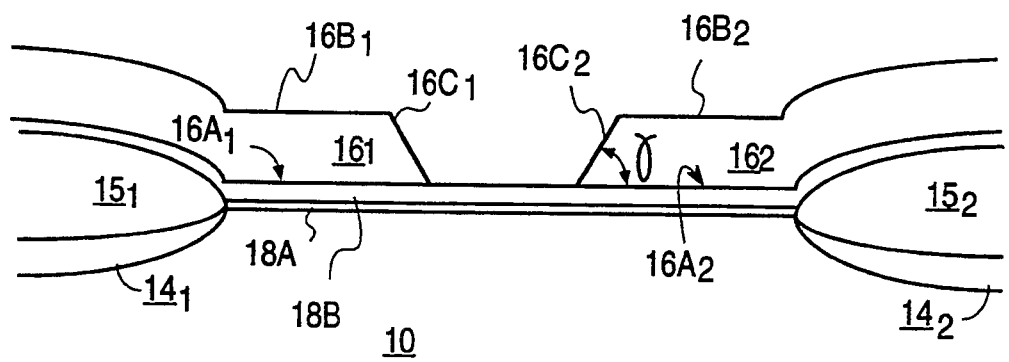
FIG. 7 illustrates the structure of FIG. 6 after removing the sacrificial silicon dioxide layer.

DRAM memory cell 120 (FIG. 12A) of this invention has a N+ conductivity type source region 113, which is part of a diffused bit line, a deep P+ conductivity type capacitance implant 111, a N conductivity type shallow capacitance implant 112, a P implant isolation region 114, sometimes called a channel stop region, and a field oxide region 115 all formed in a P− conductivity substrate 110. Here the terms "deep" and "shallow" are relative to the surface of substrate 110 on which the transistor of this invention is formed. A thin dielectric layer 118 is disposed on substrate 110 so that dielectric layer 118 overlies capacitance implant regions 111, 112 and field oxide 115.

Figure 12A:
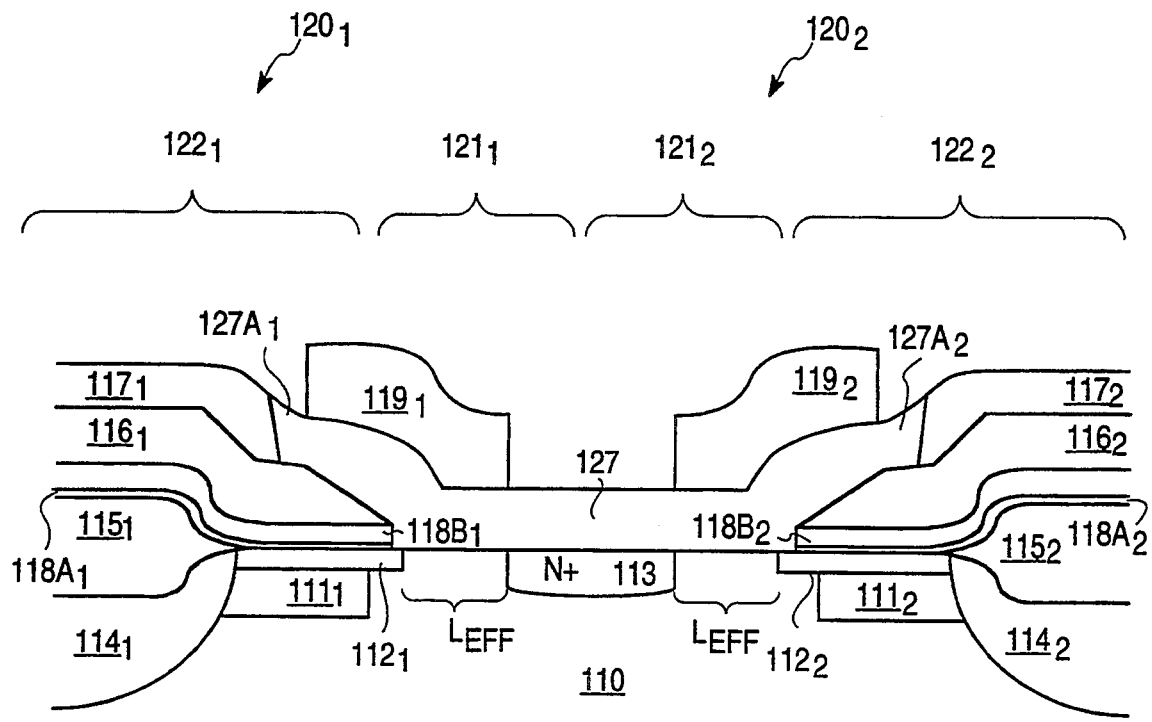
FIG. 12A illustrates a DRAM cell formed according to the principles of this invention.

In one embodiment as shown in FIG. 12A, thin dielectric layer 118 is about 150Å thick and consists of about a 50Å silicon dioxide layer 118A overlain by a 100Å silicon nitride layer 118B. Silicon nitride layer 118B also has a very thin oxide layer (not shown) formed over the nitride layer so as to seal nitride layer 118B.

The actual thickness of the dielectric layer 118 can be varied to achieve a specified dielectric constant. For example, dielectric layer 118 can be made entirely from silicon dioxide, but the dielectric constant of a silicon dioxide layer is smaller than the dielectric constant of a silicon oxide/silicon nitride layer with the same total thickness.

Figure 12B:
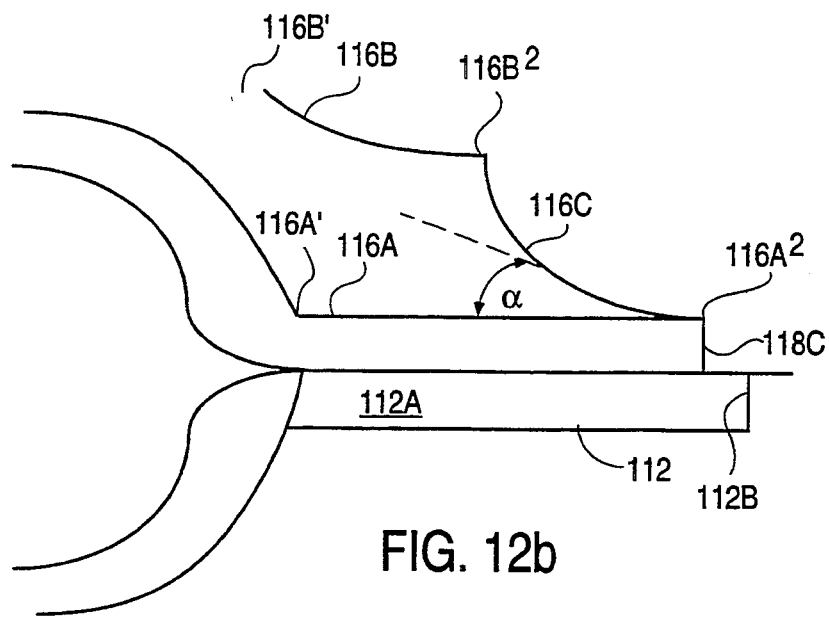
FIG. 12B is a enlarged diagram illustrating the surfaces of the capacitance polysilicon electrode of this invention.

Polysilicon capacitance storage electrode 116 is formed over capacitance implant regions 111, 112. The shape of polysilicon capacitance electrode 116 is a key feature of this invention. (In FIG. 12B, superscripts are used to denote features of the structure with the same reference numeral. As previously described, subscripts are used to represent common features in adjacent DRAM cells.) Polysilicon capacitance electrode 116 (FIG. 12B) has a first planar surface 116A which has an end $116A^1$ substantially aligned with a portion 112A of capacitance region 112 which is opposite to portion 112B of capacitance region 112 abutting channel region $L_{eff}$. A second end $116A^2$ of first planar surface 116A is substantially aligned with an edge surface 118C of insulating layer 118. A second planar surface 116B of capacitance electrode 116 is substantially parallel to surface 116A and has a first edge $116B^1$ substantially aligned with edge $116A^1$ of planar surface 116A. Planar surface 116B extends in the same direction as planar surface 116A, but a second edge $116B^2$ of surface 116B is located between edges $116A^1$ and edge $116A^2$ of first planar surface 116A so that edge surface 116C of capacitance electrode 116 is tapered as shown in FIG. 12B. The taper of surface 116C is the key to eliminating the prior art shorting of transfer gates 119 in DRAM cells 120. Angle α (FIG. 12B), formed by the intersection of edge surface 116C with first planar surface 116A, is less than 60° and preferably about 45°. Typically, angle α is greater than about 30°.

Oxide layer 117 (FIG. 12A) overlies the upper surface 116B of capacitance electrode 116, but oxide layer 117 extends over only a portion of second planar surface 116B of capacitance polysilicon layer 116. Gate oxide layer 127 overlies the channel region and source region 113 and portion 127A of gate oxide layer 127 extends over tapered edge 116C of polysilicon electrode 116 onto upper surface 116B of polysilicon electrode 116 so that oxide layer 127A abuts oxide layer 117. Over the channel region and source region, oxide layer 127 has about a 400Å thickness, but the portion of oxide layer 127 over polysilicon electrode 116 is about 1000Å thick. Transfer gate 119 overlies the channel region and a portion of polysilicon electrode 116.

The function of memory cell 120 formed according to this invention is similar to that of the prior art cells except transfer gate 119 of the cell 120 is no longer connected by polysilicon which shorts gate 119. Specifically, the relationship of transfer gate 119 and capacitance electrode 116 with respect to the capacitance, 111, 112 source, 113 and channel $L_{eff}$ regions have not been changed. Accordingly, the structure of this invention not only functions as the prior art memory cells but also provides an array of memory cells having better yields than the prior art arrays without incurring the additional expense of the processing required to remove excess polysilicon in the prior art cells.

Conventional processing steps are used to form P+ implant isolation area 114, oxide layer 115, dielectric layer 118, an N conductivity type shallow capacitance implant 112, and deep P conductivity type capacitance implant 111. Since these process steps are not critical to the invention and are known in the prior art they are not discussed in further detail.

Figure 13:
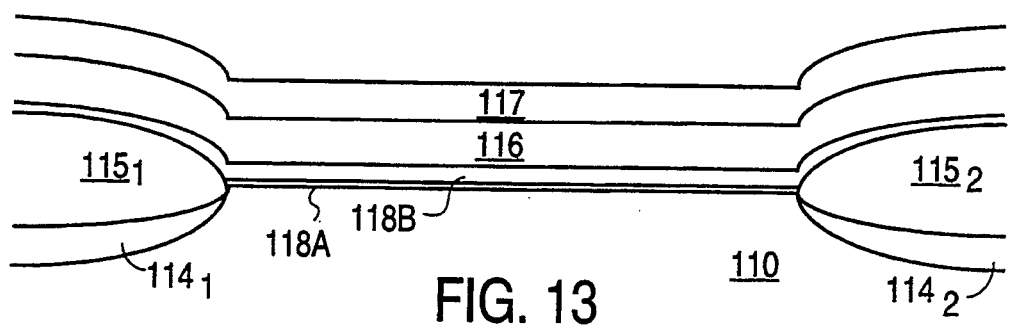
FIG. 13 illustrates the initial structure used in the formation of the polysilicon capacitance electrode according to the principles of this invention.

FIG. 13 illustrates the initial structure in the process of this invention. Specifically, substrate 110 is overlain by dielectric layer 118, a polysilicon layer 116, and an oxide layer 117. As described above the thickness of the dielectric layer is selected so as to provide a specified dielectric constant and in one embodiment is about 150Å. Polysilicon layer 116 thickness ranges from about 3300Å to 4650Å and in one embodiment was 3600Å. Similarly, oxide layer 117 thickness ranges from about 1000Å to 3000Å and in the embodiment shown in FIG. 13 is about 1000Å thick.

Figure 14:
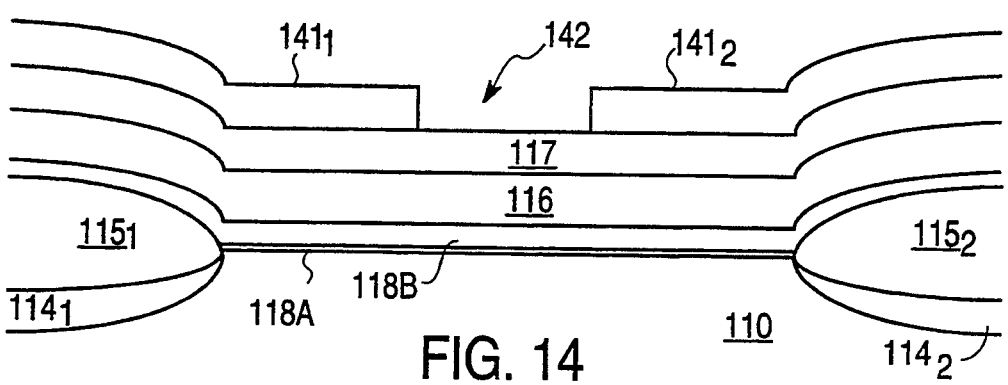
FIG. 14 illustrates the structure of FIG. 13 after a photoresist has been added according to the principles of this invention.

A photoresist 141, a masking layer, (FIG. 14) is formed on the structure of FIG. 13 and an opening 142 is formed in the photoresist using conventional processes. As in prior art processes, the lateral dimension of opening 142 is selected to achieve the best yield. The thickness of photoresist affects the subsequent etching processes. The thickness ranges from about 1 micron to about 2 microns. As the thickness of the photoresist is increased, the etching of the polysilicon layer is affected. Specifically, the angle $\alpha$ increases as the thickness of the photoresist is increased.

Figure 15:
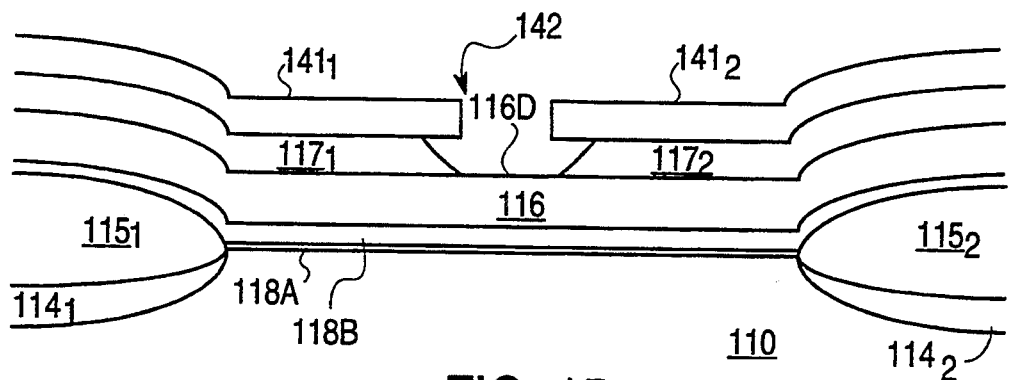
FIG. 15 illustrates the structure of FIG. 14 after an etch of the insulating layer according to the principles of the this invention.

After opening 142 in photoresist 141 is formed, a standard isotropic wet etch is used to remove oxide layer 117 so as to expose surface 116D (FIG. 15) of polysilicon layer 116. For example, in one embodiment, the etchant was one part by volume hydrofluoric acid to thirty parts ammonium fluoride by volume and was applied for about three minutes at a temperature of about 20° C. Mechanical agitation, an up and down rocking motion, was used during the wet etch.

Figure 16:
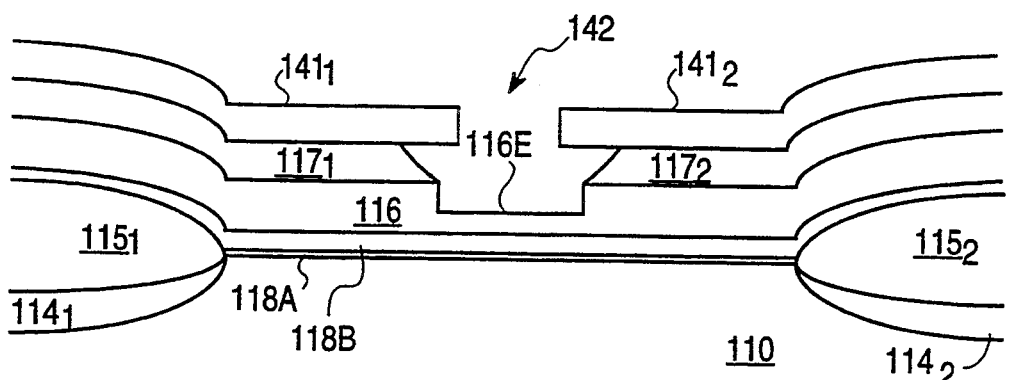
FIG. 16 illustrates the structure of FIG. 14 following a isotropic etch of the conductive layer according to the principles of this invention.

After the wet etch of oxide layer 117, the wafer is baked in a bake oven in a $N_2$ atmosphere at a temperature of about 150° C. for about 30 minutes. An anisotropic plasma etch is then used to remove a selected portion, 116E (FIG. 16) of polysilicon layer 116. In one embodiment, the plasma etch removes about 50% of the vertical extent of polysilicon layer 116 because this provides a structure for forming the desired tapered surface of polysilicon layer 116. In the plasma etching, $CF_4+O_2$ in about a 85/15 proportion was used. The power was about 100 watts and the pressure about 0.4 Torr. The plasma etch process required about 15–20 seconds to remove the 1800Å.

Figure 17:
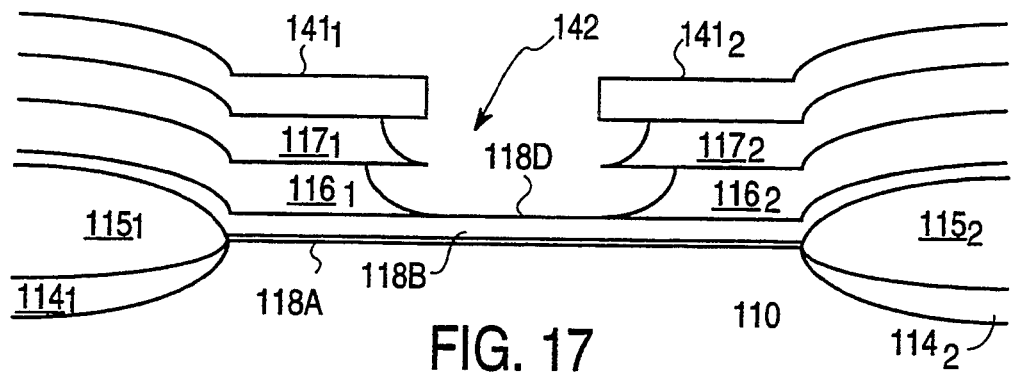
FIG. 17 illustrates the structure of FIG. 16 after an isotropic etch of the conductive layer according to the principles of this invention.

After the plasma etch of polysilicon layer 116, the wafer is again baked as described above prior to the plasma etching. An isotropic wet etch is used to remove the remaining polysilicon layer 116 under opening 142 and expose a surface 118D (FIG. 17) of dielectric layer 118B. Again, standard polysilicon wet etch techniques were used. In one embodiment, hydrofluoric acid (HF) and nitric acid ($HNO_3$) in a ratio of one part HF by volume to six parts $HNO_3$ by volume was mixed to form a etchant solution. An acetic acid and iodine mixture (2–3% iodine (wt. %)) was added to the etchant solution as a buffer so as to give an etch rate of about 1200Å/min on doped polysilicon ($\rho_s=21$ Ω-cm on crystal silicon <100>).

Figure 18:
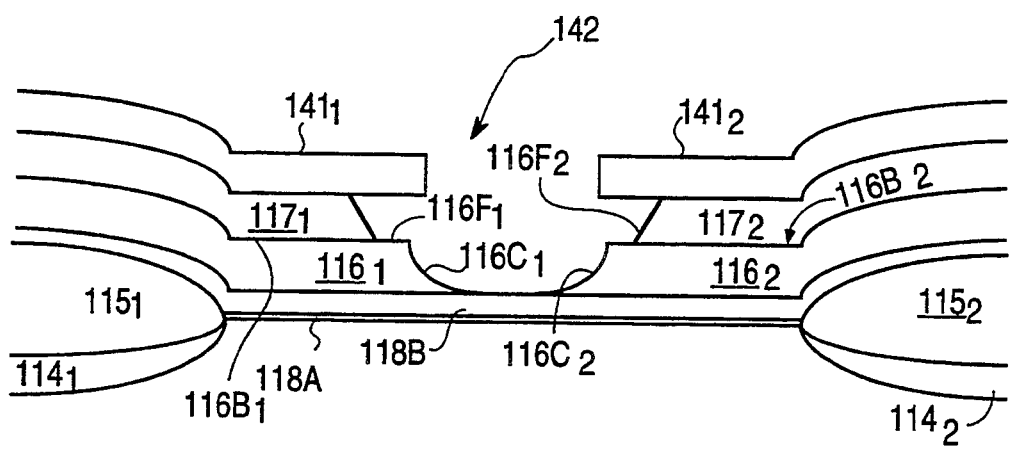
FIG. 18 illustrates the structure of FIG. 17 after another etch of the insulating layer overlying the conductive layer according to the principles of this invention.
Figure 19:
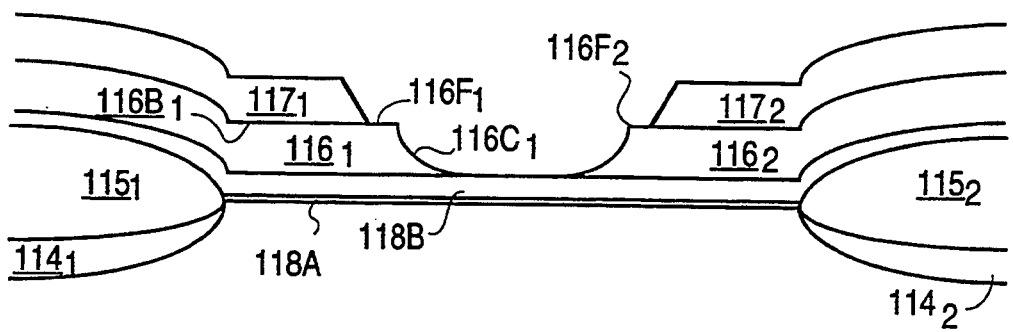
FIG. 19 illustrates the structure of FIG. 18 after the photoresist is removed according to the principles of this invention.
Figure 20:
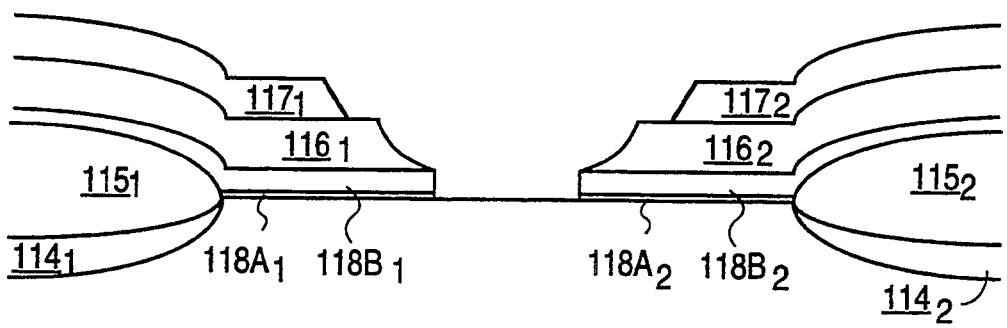
FIG. 20 illustrates the structure of FIG. 19 after the dielectric layer is removed according to the principles of this invention.
Figure 21:
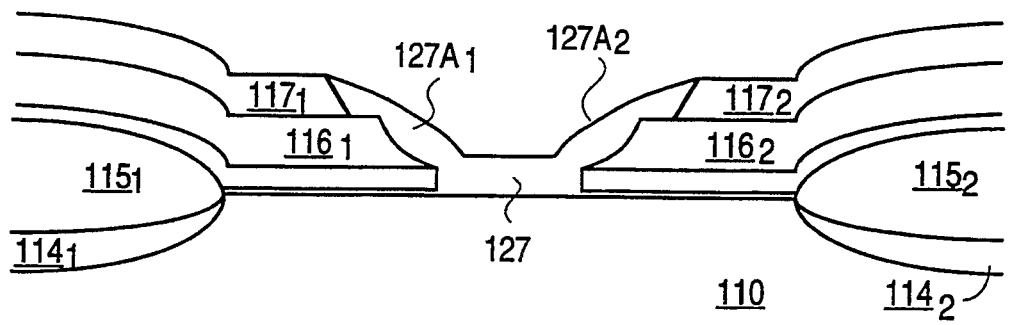
FIG. 21 illustrates the shaped conductive layer and the overlying insulating layer according to the principles of this invention.

After the wet etch of polysilicon layer 116, another standard wet etch, as described above, on oxide layer 117 is performed. After oxide layer 117 is etched so as to expose a portion 116F of upper surface 116B of polysilicon layer 116 (FIG. 18), photoresist layer 141 is stripped to produce the structure shown in FIG. 19. The undercut of layer 141 is determined by the time of the wet etch. In one embodiment, the time is in the range of about 2 to 4 minutes and preferably about 3 minutes. Dielectric layer 118 is then removed using a triple etch (FIG. 20) and polysilicon $116_1$, $116_2$ is used as a mask, as oxide layer 127 is subsequently grown (FIG. 21).

Figure 8:
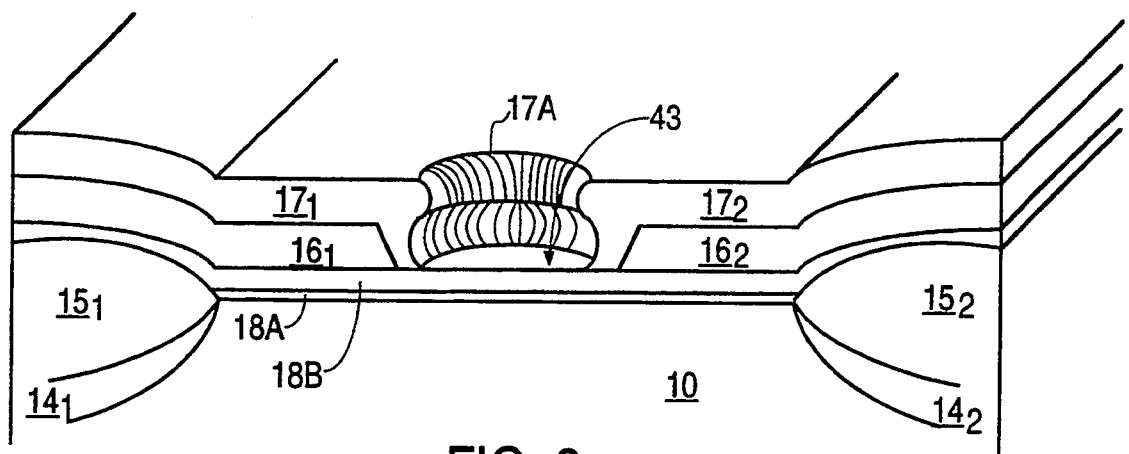
FIG. 8 is a prospective view of the structure in FIG. 7 after an oxide layer is grown over the polysilicon layer.
Figure 9:
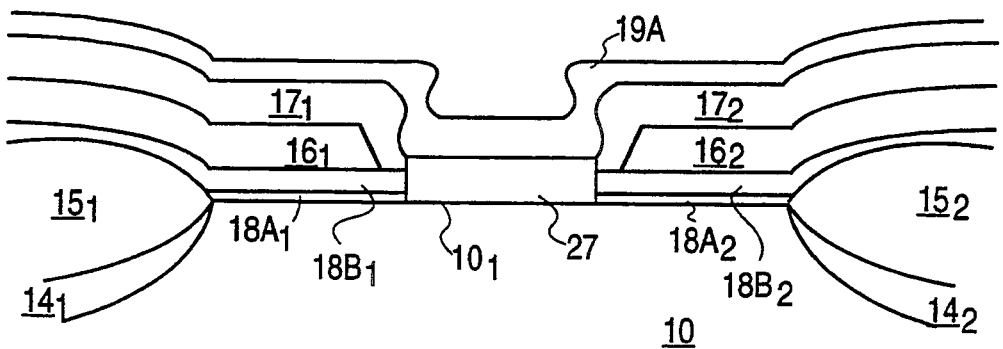
FIG. 9 illustrates the structure of FIG. 8 after a polysilicon layer is formed over the structure.
Figure 10:
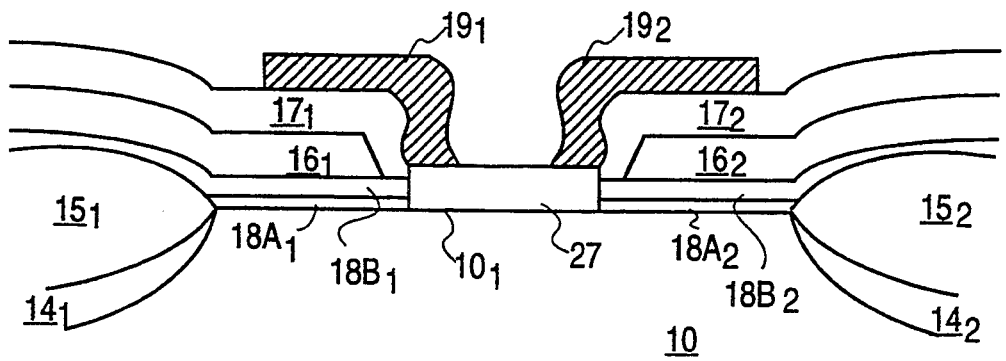
FIG. 10 illustrates the transfer gates which are formed from the structure of FIG. 9.
Figure 11:
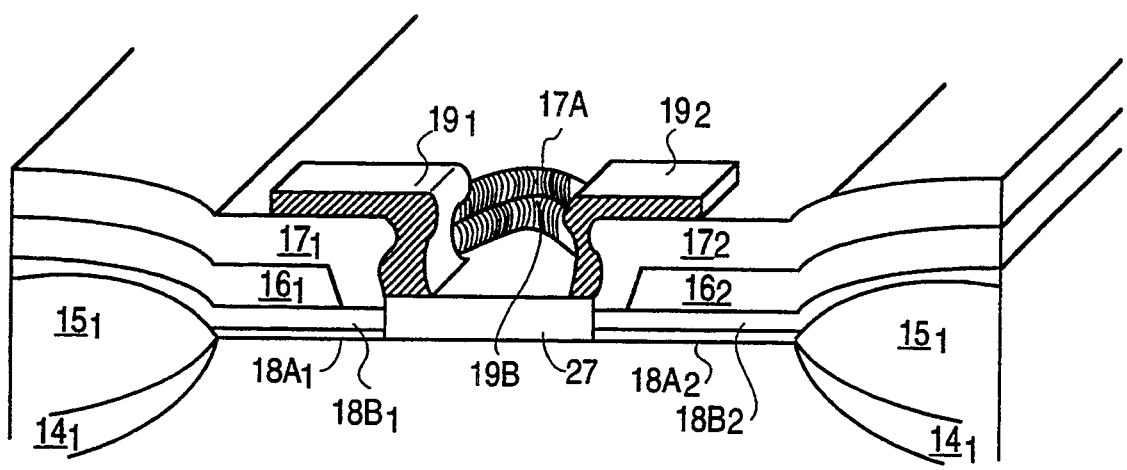
FIG. 11 is a prospective view of the structure in FIG. 10 illustrating the polysilicon connecting the transfer gates.

As gate oxide layer 127 is formed not only is an oxide layer formed on the exposed surface of substrate 110 but also an oxide layer 127A is formed over exposed polysilicon electrode 116. Thus, oxide layer 127A formed over electrode 116 abuts oxide layer 117. In one embodiment, when gate oxide layer 127 has reached a thickness of about 400Å, oxide layer 127A over capacitance polysilicon electrode 116 was about 1000Å thick so that oxide layer 117 overlying capacitance electrode 116 and oxide layer 127A formed by growth of gate oxide 127 have about the same thickness. Further, oxide 127A overlying capacitance electrode 116 does not have a lip as in the prior art structure (FIG. 8) so that in the subsequent processing steps used to form transfer gate $119_1$, $119_2$, only the polysilicon for transfer gate 119 are left because there are no unexposed surfaces which the plasma etch used to form the transfer gates does not reach.

In the above embodiment, a two step etching process was used to shape the capacitance polysilicon layer. The embodiments described herein are illustrative only and are not intended to limit the scope of the invention. In view of the above disclosure, one skilled in the art will understand that alternative conductivity types and alternative conductive and insulating layers could be used with the principles of this invention to eliminate structures, similar to the oxide lip in the prior art memory cells, which produce failure mechanisms in a semiconductor device.

Another method for forming a tapered polysilicon layer is disclosed in copending and commonly assigned U.S. patent application Ser. No. 07/517,874, entitled "A Polysilicon Taper Process Using Spin-On Glass" filed by Lloyd W. Feaver and Masanori Sakata on the date of this application, and incorporated herein by reference in its entirety.

We claim:

1. A method for forming a structure in a semiconductor device comprising the steps of:
   (i) forming a conductive layer over but insulated from a semiconductor substrate;
   (ii) forming an insulating layer disposed on said conductive layer;
   (iii) placing a mask layer on said insulating layer;
   (iv) forming an opening in said mask layer;
   (v) etching said insulating layer so as to expose a surface of the underlying conductive layer;
   (vi) anisotropically etching said conductive layer so that a selected portion of said conductive layer is removed;
   (vii) isotropically etching said conductive layer thereby shaping said conductive layer into a structure in said semiconductor device;
   (viii) etching said insulating layer so that another portion of said surface of said conductive layer is exposed, said another exposed portion of said conductive layer being adjacent to said first mentioned portion of said conductive layer; and (ix) forming a second insulating layer over said exposed portion of said conductive layer so that said second insulating layer abuts said first mentioned insulating layer.

2. A method as in claim 1 wherein said conductive layer is a polysilicon

3. A method as in claim 1 wherein said insulating layer disposed on said conductive layer is a silicon dioxide layer.

* * * * *